US012112099B2

(12) United States Patent
Frey et al.

(10) Patent No.: US 12,112,099 B2
(45) Date of Patent: Oct. 8, 2024

(54) METHOD AND ARRANGEMENT FOR CREATING A DIGITAL BUILDING MODEL

(71) Applicant: Siemens Schweiz AG, Zürich (CH)

(72) Inventors: Christian Frey, Unterägeri (CH); Peter Loeffler, Zug (CH)

(73) Assignee: SIEMENS SCHWEIZ AG, Zurich (CH)

( * ) Notice: Subject to any disclaimer, the term of this patent is extended or adjusted under 35 U.S.C. 154(b) by 409 days.

(21) Appl. No.: 17/197,675

(22) Filed: Mar. 10, 2021

(65) Prior Publication Data

US 2021/0286912 A1    Sep. 16, 2021

(30) Foreign Application Priority Data

Mar. 11, 2020  (DE) ...................... 10 2020 203 095.2

(51) Int. Cl.
*G06F 30/13* (2020.01)
*G06F 30/12* (2020.01)
*H04L 67/10* (2022.01)
*H04L 67/12* (2022.01)

(52) U.S. Cl.
CPC .............. *G06F 30/13* (2020.01); *G06F 30/12* (2020.01); *H04L 67/10* (2013.01); *H04L 67/12* (2013.01)

(58) Field of Classification Search
CPC ......... G06F 30/13; G06F 30/12; H04L 67/10; H04L 67/12
USPC .......................................................... 703/6
See application file for complete search history.

(56) References Cited

U.S. PATENT DOCUMENTS

| 2013/0135303 | A1* | 5/2013 | Densham | G06T 17/00 345/420 |
| 2016/0088286 | A1* | 3/2016 | Forsythe | G06Q 30/0623 348/46 |
| 2018/0268219 | A1 | 3/2018 | Miller | G06K 9/00 |
| 2019/0327161 | A1* | 10/2019 | Cannell | H04L 43/0817 |
| 2019/0353782 | A1* | 11/2019 | Spardel | G06V 20/52 |
| 2021/0019453 | A1* | 1/2021 | Yang | G06F 30/13 |

FOREIGN PATENT DOCUMENTS

DE          10-12-06       4/2003  ............... G06K 9/64

OTHER PUBLICATIONS

Gunther, Martin et al. "Model-based furniture recognition for building semantic object maps". Available online Jan. 5, 2015. Elsevier, Artificial Intelligence 247 (2017) 336-351 (Year: 2015).*
Office Action for DE Application No. 10 2020 203 095.2, 6 pages, Jul. 14, 2020.

* cited by examiner

*Primary Examiner* — John E Johansen
(74) *Attorney, Agent, or Firm* — Slayden Grubert Beard PLLC

(57) ABSTRACT

A method and arrangement for dynamically updating and expanding a digital building model (BIM, digital twin) with respect to furniture information for rooms, wherein the recording of the seating configuration of a room takes place by means of a correspondingly configured recording device (e.g. mapping apparatus, NavVis apparatus, smartphone camera); wherein a mapping of the seating configuration of the room into a digital building model (BIM) takes place, wherein the recording of the seating configuration of the room and the mapping of the seating configuration of the room into the digital building model (BIM) takes place in a time-controlled or event-controlled manner.

9 Claims, 3 Drawing Sheets

METHOD AND ARRANGEMENT FOR CREATING A DIGITAL BUILDING MODEL

CROSS-REFERENCE TO RELATED APPLICATIONS

This application claims priority to DE Application No. 10 2020 203 095.2 filed Mar. 11, 2020, the contents of which are hereby in-corporated by reference in their entirety.

TECHNICAL FIELD

The present disclosure relates to building design and management. Various embodiments of the teachings herein may include methods and/or arrangements for dynamically updating and expanding a digital building model with respect to furniture information for rooms.

BACKGROUND

A growing number of engineering firms and architects are using a digital building model (BIM, Building Information Model, digital twin). A digital building model enables a comprehensive exchange of information between the roles (stakeholders) participating in the creation and operation (i.e. the management) of a building. Here the components and elements of a building are typically mapped in IFC notation (Industry Foundation Classes) in the digital building model.

Digital building models (BIM models) may be created with specialized software systems and map a digital twin of the building. Digital building models (BIM models) offer possibilities for designing office buildings with a semantic description of the components, elements and parts used. After concluding the planning and building phase the aim and purpose of the planning method BIM is also to provide the users with comprehensive building information relating to the actual status of the building in the respective phase of the life cycle. This 3D representation of the building contains a plurality of static (physical infrastructures and equipment) and dynamic information (data from sensors, meters and networked objects) and thus enables everyone involved in the project (customer, facility manager, interior designer, operator) to work on the project together and with high accuracy.

A digital building model (BIM model) is attuned inter alia to the management of a building but can also be used to optimize the working areas and operating means for a building. For instance, improved use of resources, more optimal use of premises, e.g. meeting rooms. If working areas are now changed, by furniture such as partition walls, tables, seating configuration etc. being arranged differently in a room (e.g. meeting room, conference hall), this is generally not updated in the digital building model (BIM model). Therefore, this does not ensure that the digital building model of a room maps the current room situation with respect to the movable furniture.

SUMMARY

The teachings of the present disclosure include methods and arrangements, by means of which the current room situation with respect to the movable furniture in a room is consistent with the mapping of the room stored in the digital building model. For example, some embodiments include a method for dynamically updating and expanding a digital building model (BIM) with respect to furniture information (B, B1-B12) for rooms (R), the method comprising: (VS1) recording the seating configuration (B, B1-B12) in a room (R) by means of a correspondingly configured recording device (AV1-AV4); (VS2) mapping the seating configuration (B, B1-B12) of the room into a digital building model (BIM), and wherein (VS3) the recording of the seating configuration (B, B1-B12) of the room and the mapping of the seating configuration (B, B1, B2) of the room (R) into the digital building model (BIM) takes place in a time-controlled and/or event-controlled manner.

In some embodiments, the mapping of the seating configuration (B, B1-B12) of the room (R) into the digital building model (BIM) takes place immediately after recording the seating configuration (B, B1-B12).

In some embodiments, the recording of the seating configuration (B, B1-B12) of the room (R) takes place by means of a recording device (AV1-AV4) which forms part of the infrastructure of the room (R).

In some embodiments, the recording of the seating configuration (B, B1-B12) of the room (R) takes place by means of a mobile recording device (AV1-AV4).

In some embodiments, the seating configuration (B, B1-B12) of the room (R) is recorded if a change in the seating configuration (B, B1-B12) has been identified.

In some embodiments, an analysis takes place on the basis of the image of the seating configuration (B, B1-B12) of the room (R) in the digital building model (BIM), in order to determine whether the seating configuration corresponds to rules or safety guidelines.

As another example, some embodiments include an arrangement for dynamically updating and expanding a digital building model (BIM) with respect to furniture information (B, B1-B12) for rooms (R), the arrangement comprising: a recording device for recording the seating configuration (B, B1-B12) of a room (R); a transfer apparatus for the data-related transfer of the recorded seating configuration (B, B1-B12) to a server (S) via suitable communication links (KV1-KV4); a server (S) which is configured to receive a transferred seating configuration (B, B1-B12) and to map the same into a suitable notation of a digital building model (BIM), wherein the server (S) has access to a database (DB), in which the digital building model (BIM) is stored in a suitable notation; wherein the recording device (AV1-AV4) is configured to perform the recording of the seating configuration (B, B1-B12) of the room (R) in a time-controlled and/or event-controlled manner, and to perform the transfer of the recorded seating configuration (B, B1-B12) to the server (S) immediately after the recording.

In some embodiments, the server (S) is configured to map a transferred seating configuration (B, B1-B12) in real time into a suitable notation of the digital building model (BIM).

In some embodiments, the arrangement comprises an evaluation unit, for identifying infringements against rules and/or safety guidelines in the case of a recorded seating configuration (B, B1-B12).

In some embodiments, the arrangement comprises an output device, for outputting fault indications when infringements against rules and/or safety guidelines for a recorded seating configuration (B, B1-B12) are identified.

In some embodiments, the arrangement is part of a building safety or building evaluation system.

BRIEF DESCRIPTION OF THE DRAWINGS

The teachings of the present disclosure and advantageous embodiments thereof are described using the example of the following figure. In the figures.

DETAILED DESCRIPTION

Figure 1:
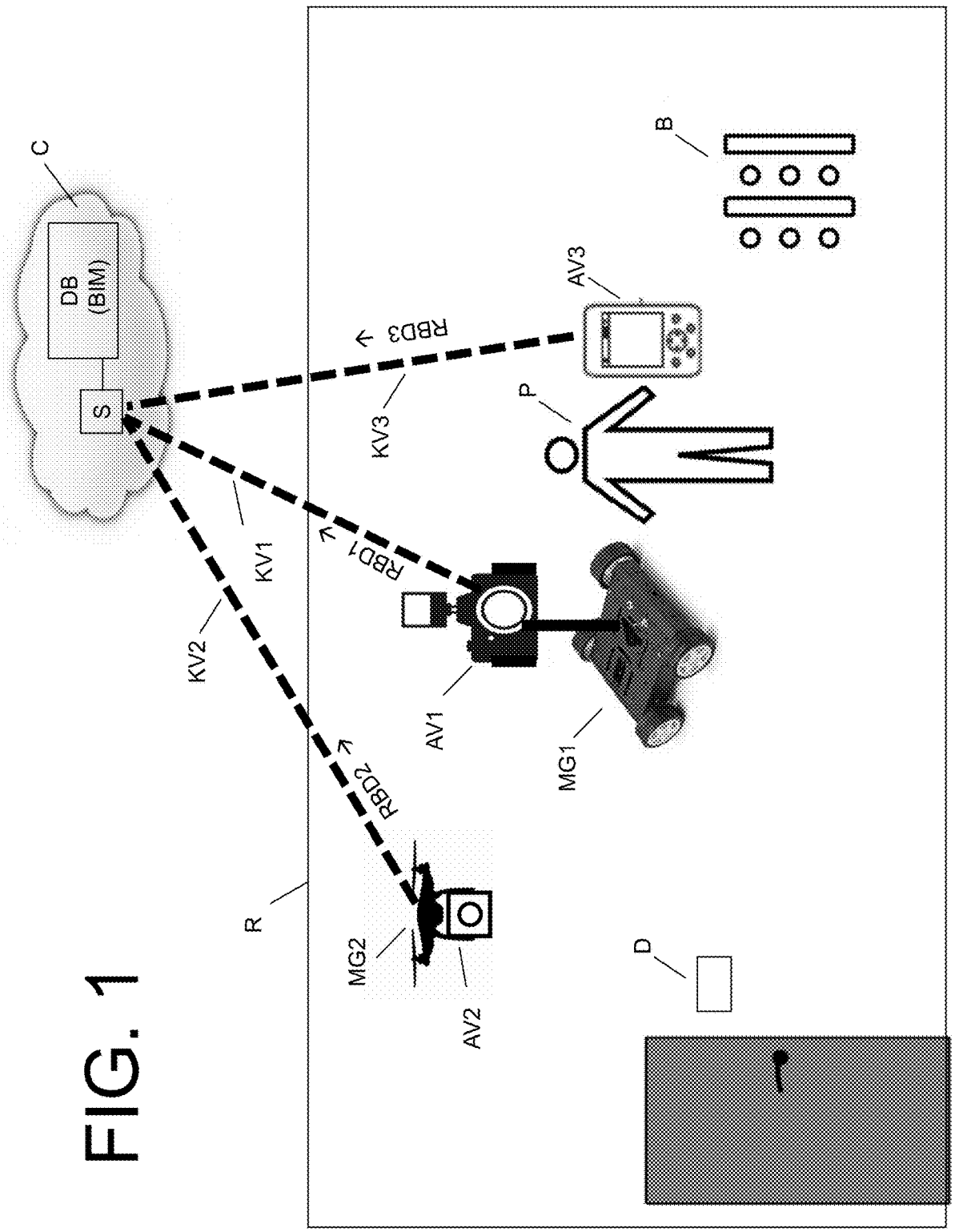
FIG. 1 shows a first exemplary arrangement for dynamically updating and expanding a digital building model incorporating teachings of the present disclosure.

In some embodiments, there is a method for dynamically updating and expanding a digital building model (BIM, digital twin) with respect to furniture information for rooms, the method comprising: recording the seating configuration of a a room using correspondingly configured recording device (e.g. mapping apparatus, NavVis apparatus, smartphone camera); mapping the seating configuration of a room into a digital building model (BIM), wherein the recording of the seating configuration of a room and the mapping of the seating configuration of the room into the digital building model (BIM) takes place in a time-controlled and/or event-controlled manner. In order nowadays to find out how the seating configuration is currently set up in a meeting room, for instance, in order to check whether the seating configuration and further movable objects in the room (e.g. plant pots, bins, room infrastructure apparatuses) is/are suitable for an intended event, an operator must record the current conditions on site. This must then be transferred manually into the building model (BIM model). This is complex, prone to error and does not ensure that the entries in the building model match with the situation on site (i.e. in the respective room). The present method ensures that the entries in the building model are kept up to date with respect to movable furniture and correspond to the situation on site in the room.

In some embodiments, the recording device (e.g. mapping apparatus, NavVis apparatus, smartphone camera) is adapted to record and/or monitor the seating configuration of a room and/or a floor and/or a hall of a building. The recording of the seating configuration of the room and the mapping of the seating configuration of the room into the digital building model (BIM) can take place in a time-controlled manner, e.g. at a defined point in time. For instance, security personnel on night watch can use a mobile communication terminal (e.g. smartphone) to take one or more photos or a film of the seating configuration of a room at a specific point in time or in a defined time period and can render these recordings on a BIM server for entry and mapping into the BIM model. Such recordings of the furniture (e.g. seating configuration) can also be made by a camera of a mobile and autonomous cleaning robot and transmitted to the BIM server. Autonomous cleaning robots can operate in accordance with a defined time-controlled cleaning plan. In some embodiments, cleaning robots move self-sufficiently in a building. However, such recordings of the furniture can also be made by a recording device which forms part of the infrastructure or the equipment of the room, e.g. camera of a computer or a communication device (e.g. equipment for video conferences). When the recordings are transmitted to the BIM server, these recordings are advantageously provided with suitable meta data (tags, attributes), such as e.g. time instant of the recordings, transmitter, room ID (room identification data).

In some embodiments, the recording of the seating configuration of the room and the mapping of the seating configuration of the room into the digital building model (BIM model) can also take place in an event-controlled or combined manner (time-controlled/event-controlled). An event can be, for instance, a use of the room or a change in the seating configuration. An event can be identified by a suitable sensor system (e.g. presence detectors). A recording device, which forms part of the infrastructure or the equipment of the room, advantageously receives a command from the sensor system, when an event is identified (e.g. event is over), to take one or more photos or a film of the room. The recordings advantageously take place with different positions (recording views) of the recording device, e.g. with a camera which can be rotated about a number of axes disposed in the room). After their creation, the recording device transmits these recordings directly to the BIM server. This ensures the update of the BIM model. The recording device is advantageously coupled to the lighting system of the room (e.g. by means of a corresponding radio link) and is configured to provide commands to the lighting system in order to achieve suitable lighting conditions for recordings (e.g. adequate brightness, if recordings are made at night at the end of an event).

In some embodiments, the mapping of the seating configuration of the room into the digital building model (BIM) takes place immediately after recording the seating configuration. This ensures that the mapping of the seating configuration of the room in the digital building model (BIM) is always up-to-date, i.e. consistent with the (physical) seating configuration on site.

In some embodiments, the recording of the seating configuration of the room takes place by means of a recording device which forms part of the infrastructure of the room. Meeting rooms or conference rooms are nowadays equipped with an infrastructure for video conferences. This infrastructure comprises cameras (e.g. integrated on or in monitors). The recording of the seating configuration of the room by means of a recording device which belongs to the infrastructure of the room can take place in a time-controlled manner, e.g. at fixed and definable points in time or time intervals. The recording of the seating configuration of the room by means of a recording device which belongs to the infrastructure of the room can however also be carried out in an event-controlled manner, e.g. if corresponding sensor systems (e.g. presence detectors, movement detectors) identify that an event in the room has ended.

In some embodiments, the recording of the seating configuration of the room takes place by means of a mobile recording device. The mobile recording device can be a mobile communication terminal (e.g. smartphone) or a camera, which forms part of a mobile (advantageously) autonomous cleaning robot. The mobile recording device can also be a mobile device for mapping the building (e.g. NavVis trolley).

In some embodiments, the seating configuration of the room is recorded if a change in the seating configuration has been identified. A change in the seating configuration can be identified for instance by means of a corresponding sensor system in the room, or by means of corresponding pattern recognition software of the recording device.

In some embodiments, an analysis takes place on the basis of the mapping of the seating configuration of the room in the digital building model (BIM) to determine whether the seating configuration corresponds to rules or safety guidelines. This can take place, for instance, by means of corresponding analysis software (e.g. by pattern recognition) in the digital building model (BIM). If it is identified, for instance, that escape routes or emergency doors are blocked as a result of the seating configuration, a corresponding message is advantageously output to a building control system (e.g. management station). A corresponding warning message is advantageously displayed on a display in the room and/or on the entrance door to the room.

In some embodiments, there is an arrangement for dynamically updating and expanding a digital building model (BIM, digital twin) with respect to furniture information for rooms, the arrangement comprising: a recording device for recording the seating configuration of a room (e.g. mapping device, NavVis apparatus, smartphone camera); a transmission device for the data-related transfer of the recorded seating configuration to a server (BIM server) via suitable communication links (e.g. radio link); a server which is configured to receive a transferred seating configuration and to map the same into a suitable notation of a digital building model (BIM), wherein the server has access to a database, in which the digital building model (BIM) is stored in a suitable notation; wherein the recording device is configured to perform the recording of the seating configuration of the room in a time-controlled (or event-controlled) manner and to perform the transfer of the recorded seating configuration to the server immediately after the recording. The recording device (e.g. camera) may be part of an infrastructure (e.g. video conference facility) which forms part of the room. A recording of the seating configuration of the room advantageously takes place if a change in the seating configuration has been identified. This can take place for instance by means of a corresponding sensor system (e.g. motion detectors; touch-sensitive floors) which is present in the room.

In some embodiments, the server is configured to map a transferred seating configuration in real time into a suitable notation of the digital building model (BIM). This ensures that the contents of the digital building model map the current seating configuration on site and are thus consistent.

In some embodiments, the arrangement comprises an evaluation unit for identifying infringements against rules and/or safety guidelines in the case of a recorded seating configuration. The evaluation unit can be, for instance, corresponding analysis software of the server, in order to scan and to analyze data stored in the digital building model.

In some embodiments, the arrangement comprises an output device for outputting fault messages when infringements against rules and/or safety guidelines are identified for a recorded seating configuration. If it is identified, for instance, that escape routes or emergency doors are blocked by the seating configuration, a corresponding message may be output to a building control system (e.g. management station; surveillance monitor). A corresponding warning message is advantageously displayed on a display in the room and/or on the entrance door to the room.

In some embodiments, the arrangement is part of a building safety and/or building evacuation system. The arrangement can be easily integrated into a building safety or building evacuation system, or building automation system, by means of conventional hardware and software.

FIG. 1 shows a first exemplary arrangement for dynamically updating and expanding a digital building model BIM incorporating teachings of the present disclosure. The exemplary arrangement for dynamically updating and expanding a digital building model BIM (digital twin) with respect to furniture information for rooms R (e.g. meeting rooms, conference rooms) comprises: a recording device AV1-AV3 (e.g. mapping apparatus, NavVis apparatus, smartphone camera, drone with camera) for recording the seating configuration B of a room R; a transmission device for the data-related transfer of the recorded seating configuration B to a server S (BIM server) via a suitable communication link KV1-KV3; a server S which is configured to receive a transferred seating configuration B and to map the same into a suitable notation of a digital building model BIM (digital twin), wherein the server S has access to a database DB (or to a suitable storage medium), in which the digital building model BIM is stored in a suitable notation (e.g. IFC notation); wherein the recording device AV1-AV3 is configured to perform the recording of the seating configuration B of the room R in a time-controlled and/or event-controlled manner, and to perform the transfer of the recorded seating configuration B to the server S immediately after the recording. A transmission device for the data-related transfer of the recorded seating configuration B to the server S (BIM server) can be suitable radio modules, for instance. The communication links KV1-KV3 can be e.g. suitable radio links. Recorded seating configurations B are transmitted in a suitable data structure as spatial image data RBD1-RBD3 by the recording devices ASV1-AV3 to the server S via the communication links KV1-KV3. The server S (e.g. a correspondingly configured workstation or PCT) maps the received spatial image data RBD1-RBD3 into the digital building model BIM. The spatial image data RBD1-RBD3, which represents in each case a recorded seating configuration B in a suitable notation (e.g. IFC, Industry Foundation Class), is stored in the digital building model BIM. The digital building model BIM is stored in a corresponding database DB or a corresponding storage medium of the server S. The server S and the database DB are advantageously realized in a cloud infrastructure. The communication links KV1-KV3 are e.g. wireless communication links (e.g. WLAN, radio). The transmission device is corresponding transmit and receive devices (e.g. radio modules).

In the representation according to FIG. 1, the recording device AV1 (e.g. camera) is attached to a mobile device MG1. The mobile device MG1 can be a mobile cleaning robot, or a building mapping apparatus (e.g. mapping trolley by the company NavVis). The recording device AV2 (e.g. camera) is attached by way of example to a mobile device MG2 (drone). The recording device AV3 is by way of example a smartphone of a user P (e.g. security personnel).

Furthermore, a room booking (e.g. in an electronic calendar system) can require a specific seating configuration B. After adapting a seating configuration, e.g. the facility manager P uses the smartphone AV3 to make a recording and sends this via a suitable communication link KV3 to the server S for entry into the BIM model BIM, wherein the current seating configuration is assumed. The invention is not restricted to office buildings and can also be applied to other trades, such as e.g. factory buildings, sports facilities, etc. These can also be recorded with camera drones MG2, for instance, which are controlled manually or fly over a saved route.

The server S may be configured to map a transferred seating configuration B in real time into a suitable notation (e.g. IFC; suitable object-oriented notation) of the digital building model BIM.

In some embodiments, the arrangement comprises an evaluation unit (e.g. analysis algorithms, pattern recognition algorithms) for identifying infringements against rules and/or safety guidelines with a recorded seating configuration B.

The evaluation unit may include a software module in the server, which is equipped with corresponding functionality. The server is equipped with suitable processor, storage, and communication means.

In some embodiments, the arrangement comprises an output device D, for outputting fault messages when infringements against rules and/or safety guidelines are identified for a recorded seating configuration B. The output device D can be e.g. a display D in the room and/or at the entrance to the room. The arrangement may be part of a building safety system or building evacuation system or a building automation system.

Figure 2:
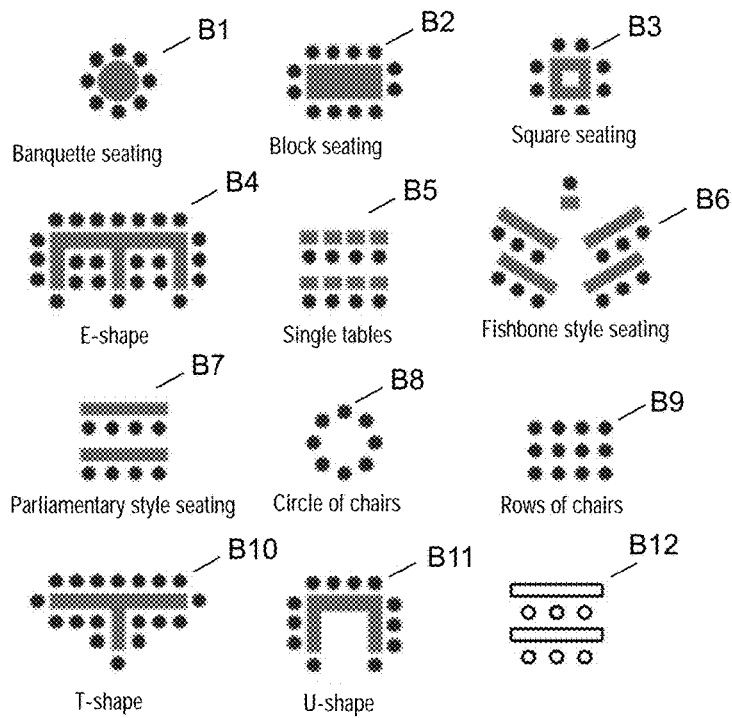
FIG. 2 shows exemplary seating configuration types incorporating teachings of the present disclosure.

FIG. 2 shows exemplary seating configuration types or types of seating configurations B1 to B12. Often the seating configuration in a room is changed and the information about the changed seating configuration is not documented. The teachings of the present disclosure provides that the currently existing seating configuration of a room is stored consistently and reliably in a digital building model. Identified to the seating configuration are recorded immediately (e.g. in real time) in the digital building model. During utilization planning for meeting rooms or conference rooms, the current information relating to the seating configuration stored in the digital building model is advantageously accessed. In the building model, each type of seating configuration B1 to B12 is mapped in a corresponding notation or data structure. This information can be accessed e.g. by a building control system or by an electronic calendar (e.g. Outlook). Corresponding data analyses (e.g. pattern recognition software, object recognition software) allows a seating configuration B1-B12 to be analyzed with other spatial information stored in the building model. As a result, it is possible to determine e.g. whether escape routes or escape doors in the room are hindered or blocked by a seating configuration. The safety situation in the room can therefore be checked by corresponding data analyses, for instance.

Figure 3:
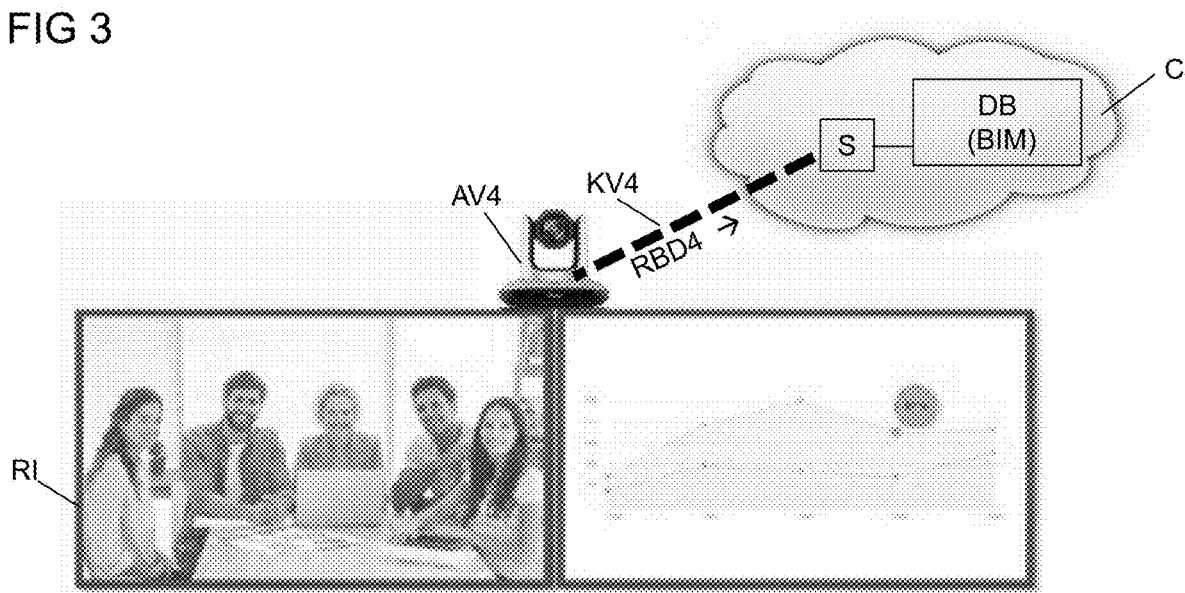
FIG. 3 shows a second exemplary arrangement for dynamically updating and expanding a digital building model incorporating teachings of the present disclosure.

FIG. 3 shows a second exemplary arrangement for dynamically updating and expanding a digital building model BIM (digital twin) with respect to furniture information for rooms incorporating teachings of the present disclosure. The exemplary arrangement according to FIG. 3 comprises: a recording device AV4 (e.g. camera, Lidar, Ladar) for recording the seating configuration of a room; a transmission device for the data-related transmission of the recorded seating configuration to a server S (BIM server); a server S which is configured to receive a transferred seating configuration and to map the same into a suitable notation of a digital building model BIM, wherein the server S has access to a database DB, in which the digital building model BIM is stored in a suitable notation (e.g. IFC); wherein the recording device AV4 is configured to perform the recording of the seating configuration of the room in a time-controlled manner (e.g. at a specific definable time) and/or in an event-controlled manner, and to perform the transfer of the recorded seating configuration to the server S immediately after the recording. In the exemplary arrangement according to FIG. 3, the recording device AV4 is integrated in the room infrastructure RI of a room, e.g. in a video conference infrastructure. The recording device AV4 can be e.g. a video camera, a LIDAR device (Light Detection And Ranging) or a LADAR device (Laser Detection And Ranging).

In some embodiments, the method includes recording the current setup and seating configuration of a room and also other objects using cameras (e.g. video cameras, LIDAR, LADAR) in the premises and to automatically actively expand the BIM model with the identified objects so that a current mapping in the digital twin is produced. This analysis can take place by means of cameras, for instance, which are installed e.g. for security purposes in a building or in rooms (e.g. security cameras). In conference rooms, the conference camera AV4 can also be used for this, for instance. The conference camera AV4 sends a recorded seating configuration via the communication link KV4 (e.g. radio link, IP network) in a suitable data structure and a suitable data format RDB4 to the server S for updating and entry into the digital building model BIM. A corresponding item of semantic information relating to the recorded seating configuration may be stored in the digital building model BIM. A query as to how many tables, chairs or other infrastructure are currently located in a specific room is therefore possible, for instance. The item of semantic information therefore represents machine-readable dynamic attributes of the respective room. The digital building model BIM therefore represents not only a two-dimensional or three-dimensional representation, but instead a semantic modeling (e.g. for a corresponding room).

The semantic model defines knowledge in the background and therefore creates a higher degree of interoperability of data stored in the BIM. The degree of capacity utilization of a room (ratio of people/seating configuration) can therefore be shown, for instance. The server S and the database DB are advantageously realized in a cloud infrastructure C. In particular with a time-controlled recording of the seating configuration, it is ensured that a transmission of the seating configuration information to the server S only then takes place if a change in the seating configuration takes place in the room.

Figure 4:
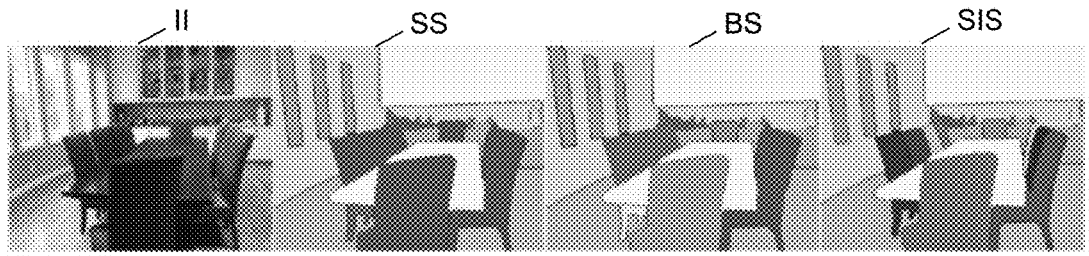
FIG. 4 shows an exemplary segmentation method for an image processing incorporating teachings of the present disclosure.

FIG. 4 shows by way of example segmentation methods for an image processing, suited to the recording, recognition and mapping of a seating configuration of a room into a digital building model (BIM, digital twin) incorporating teachings of the present disclosure. The electronic segmentation is a subarea of the digital image processing. Segmentation comprises the generation of regions which are associated as regards content by combining adjacent pixels or regions in accordance with a defined homogeneity criterion. Segmentation methods comprise pixel, edge or region-oriented methods. Furthermore, model-based methods are known in which a specific form of the objects is assumed, and texture-based methods in which an internal homogeneous structure of objects (e.g. furniture, chairs, tables) is also taken into account. The objects in a digital model are advantageously provided or expanded with meta information (e.g. dimensions, weight, material).

In the representation according to FIG. 4, the partial image II shows an input image recorded e.g. by a camera, the partial image SS shows an associated exemplary semantic segmentation, the partial image BS shows an associated exemplary boundary segmentation edge detection) and the partial image SIS shows an associated exemplary semantic instance segmentation. The corresponding segmentations are carried out by means of suitable software for image processing on a correspondingly configured server (workstation, personal computer) for a suitable mapping of the furniture into the digital building model.

The BIM model (digital building model) and thus the digital twin of the building (immovable property) is expanded dynamically with the furniture located in a room. Previously, if at all, only static elements or room layouts and their furniture which are fixed in the planning phase were known. Current object recognition methods are used to identify known objects in the room and to determine their position. The objects are stored in an object database, for instance. In the digital twin (BIM model) the object (chair, table) identified as relevant is taken from the BIM object database and positioned. To this end it is important that the recordings of the camera are calibrated with the BIM model, which can take place e.g. by way of edge detection of static elements in the room such as door, window, corner of a room, inscriptions, etc. and/or a "fingerprint". Furthermore, the position of the recording, which facilitates the assignment to a room, can be transmitted via positioning systems (IPS).

Customers, such as e.g. conference organizers or office lessors, obtain current information relating to the furniture located in the room and can conclude the room utilization on the basis of the arrangement, e.g. with access by means of an electronic calendar system. The compliance with safety regulations, for instance, can also be monitored (number of people in the room with a whole area seating configuration).

Figure 5:
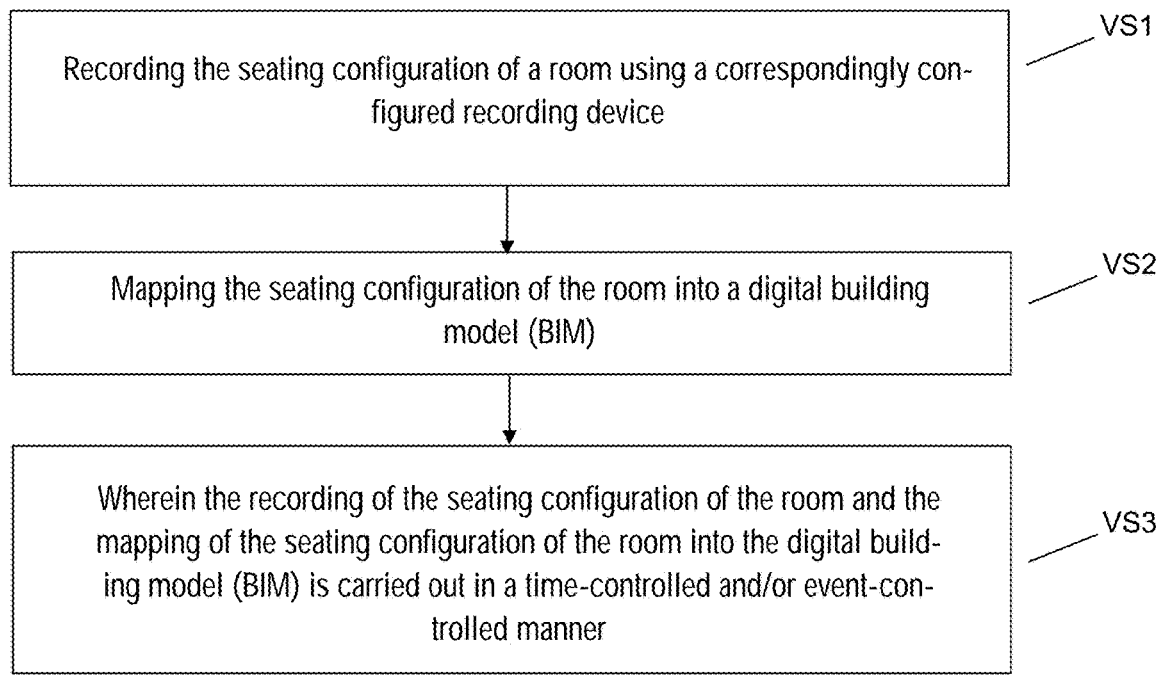
FIG. 5 shows an exemplary flow chart for a method for dynamically updating and expanding a digital building model incorporating teachings of the present disclosure.

FIG. 5 shows an exemplary flow chart for a method for dynamically updating and expanding a digital building model (BIM, digital twin) with respect to furniture information for rooms incorporating teachings of the present disclosure. The method comprises the following steps: (VS1) recording the seating configuration of a room using a correspondingly configured recording device (e.g. mapping apparatus, NavVis apparatus, smartphone camera); (VS2) mapping the seating configuration of the room into a digital building model (BIM), and (VS3) the recording of the seating configuration of the room and the mapping of the seating configuration of the room into the digital building model (BIM, digital twin) is carried out in a time-controlled and/or event-controlled manner. The method is carried out in a computer-implemented manner with correspondingly configured hardware means (e.g. computer, processor), software means (e.g. programs for image processing and/or pattern recognition), storage means (e.g. database, RAM, ROM) and communication means (e.g. radio, Internet, Intranet). The method is advantageously realized in a cloud infrastructure.

In some embodiments, the mapping of the seating configuration of the room into the digital building model (BIM) takes place immediately after the recording of the seating configuration.

In some embodiments, the recording of the seating configuration of the room is carried out by means of a recording device (e.g. camera) which forms part of the infrastructure of the room.

In some embodiments, the recording of the seating configuration of the room takes place by means of a mobile recording device (e.g. mobile communication terminal, smartphone).

In some embodiments, the seating configuration of the room is recorded if a change in the seating configuration has been identified. A change in the seating configuration can be identified e.g. by a corresponding sensor system in the room and/or by corresponding pattern recognition or image processing software. An analysis as to whether the seating configuration corresponds to rules or safety guidelines advantageously takes place on the basis of the mapping of the seating configuration of the room into the digital building model (BIM).

REFERENCE SIGNS

C Cloud
BIM Building model
S Server
R Room
D Display
KV1-KV4 Communication link
User
B, B1-B12 Seating configuration
AV1-AV2 Recording device
RBD1-RBD4 Room image data
MG1-MG2 Mobile device
II Input image
SS Semantic segmentation
BS Edge segmentation
SIS Semantic instance segmentation
RI Room infrastructure
VS1-VS3 Method step

The invention claimed is:

1. A method for managing a building using a digital building model, the method comprising:
   based on a trigger, automatically capturing an image of a room reflecting a current seating configuration in the room using a recording device comprising at least one device selected from the group consisting of: a camera, a Light Detection and Ranging (LIDAR) device, and a Laser Detection and Ranging (LADAR) device;
   transferring the recorded current seating configuration to a server storing the digital building model;
   analyzing the recorded current seating configuration using one or more processors associated with the server;
   wherein the trigger includes either a defined point in time or a predefined event;
   wherein analyzing the recorded current seating configuration includes assessing an image of the current seating configuration with a pattern recognition program by mapping the seating configuration of the room into the digital building model by a semantic segmentation based on a boundary segmentation edge detections and a semantic instance segmentation to determine whether the current seating configuration violates any rules stored in the digital building model; and
   if the current seating configuration violates one or more rules, sending a warning message to a building control station and/or a display associated with the room;
   if the current seating configuration does not violate any rules, storing a semantic model of the room including the current seating configuration in the digital building model.

2. The method as claimed in claim 1, wherein mapping the seating configuration of the room into the digital building model takes place immediately after analyzing the seating configuration.

3. The method as claimed in claim 1, wherein the recording device forms part of the infrastructure of the room.

4. The method as claimed in claim 1, wherein the recording device comprises a mobile recording device.

5. The method as claimed in claim 1, wherein the trigger includes a change in the seating configuration.

6. A system for managing a building using a digital building model, the system comprising:
   a recording device for capturing an image of a room reflecting a current seating configuration of a room, the recording device selected from the group consisting of: a camera, a Light Detection and Ranging (LIDAR) device, and a Laser Detection and Ranging (LADAR) device;
   a server storing the digital building model in an associated database;
   a communication link for transferring the captured image to the server via communication links;

wherein the server includes one or more processors configured to receive the captured image and to map the same into a notation of the digital building model;

wherein the one or more processors analyze the captured image including assessing the current seating configuration with a pattern recognition program by mapping the seating configuration of the room into the digital building model by a semantic segmentation based on a boundary segmentation edge detections and a semantic instance segmentation to determine whether the current seating configuration violates any rules stored in the digital building model; and if the current seating configuration violates one or more rules, the one or more processors send a warning message to a building control station and/or a display associated with the room;

if the current seating configuration does not violate any rules, the one or more processors store a semantic model of the room including the current seating configuration in the digital building model wherein the recording device is configured to perform the recording of the seating configuration of the room based on a trigger including either a defined point in time or a predefined event, and to perform the transfer of the recorded seating configuration to the server immediately after the recording.

7. The system as claimed in claim 6, wherein the server maps a transferred seating configuration in real time into a suitable notation of the digital building model.

8. The system as claimed in claim 6, wherein the display is configured to indicate a fault status when infringements against rules and/or safety guidelines for a recorded seating configuration are identified.

9. The arrangement as claimed in claim 6, wherein the arrangement is part of a building safety or building evaluation system.

* * * * *